United States Patent
Freund et al.

(10) Patent No.: US 6,277,234 B1
(45) Date of Patent: Aug. 21, 2001

(54) METHOD AND APPARATUS FOR REMOVING WORK PIECES ADHERED TO A SUPPORT

(75) Inventors: Joseph Michael Freund, Fogelsville; George John Przybylek, Douglasville; Dennis Mark Romero, Allentown, all of PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/323,041

(22) Filed: Jun. 1, 1999

(51) Int. Cl.[7] .................................................. B32B 35/00
(52) U.S. Cl. ...................... 156/344; 156/584; 438/464; 29/426.6
(58) Field of Search .................................... 156/247, 249, 156/344, 584; 438/464, 976; 29/426.1, 426.5, 426.6, 603.02, 762

(56) References Cited

U.S. PATENT DOCUMENTS

| | | | | |
|---|---|---|---|---|
| 3,537,603 | * | 11/1970 | Willis et al. | 29/426.1 |
| 3,547,744 | * | 12/1970 | Buchaklian, Jr. | 156/584 |
| 4,173,507 | * | 11/1979 | Tobey | 156/584 X |
| 4,177,104 | * | 12/1979 | Parker | 156/584 |
| 5,569,354 | * | 10/1996 | Day | 156/584 |
| 5,879,505 | * | 3/1999 | Fujisawa et al. | 156/344 |
| 6,039,833 | * | 3/2000 | Freund et al. | 156/344 |
| 6,136,137 | * | 10/2000 | Farnworth et al. | 156/344 |

* cited by examiner

*Primary Examiner*—Mark A. Osele
(74) *Attorney, Agent, or Firm*—Dickstein Shapiro Morin & Oshinsky LLP

(57) ABSTRACT

A demounting apparatus is described which releases semiconductor work pieces from an adhesive support structure. The demounting apparatus includes a conduit with a pair of opposed openings. A support structure is placed over one of the openings with a work piece mounted on a lower surface thereof. A vacuum is exerted on the conduit through a constricted outlet, thereby creating a pressure differential. The lower pressure within the demounting apparatus causes the support structure to elastically deform, thereby reducing its adherence on the work piece. The work piece is dislodged from the support structure and caught by a cushion positioned in the other opening. The cushion is pushed inwardly by the pressure differential. Other structures for releasing the work piece are also disclosed.

52 Claims, 5 Drawing Sheets

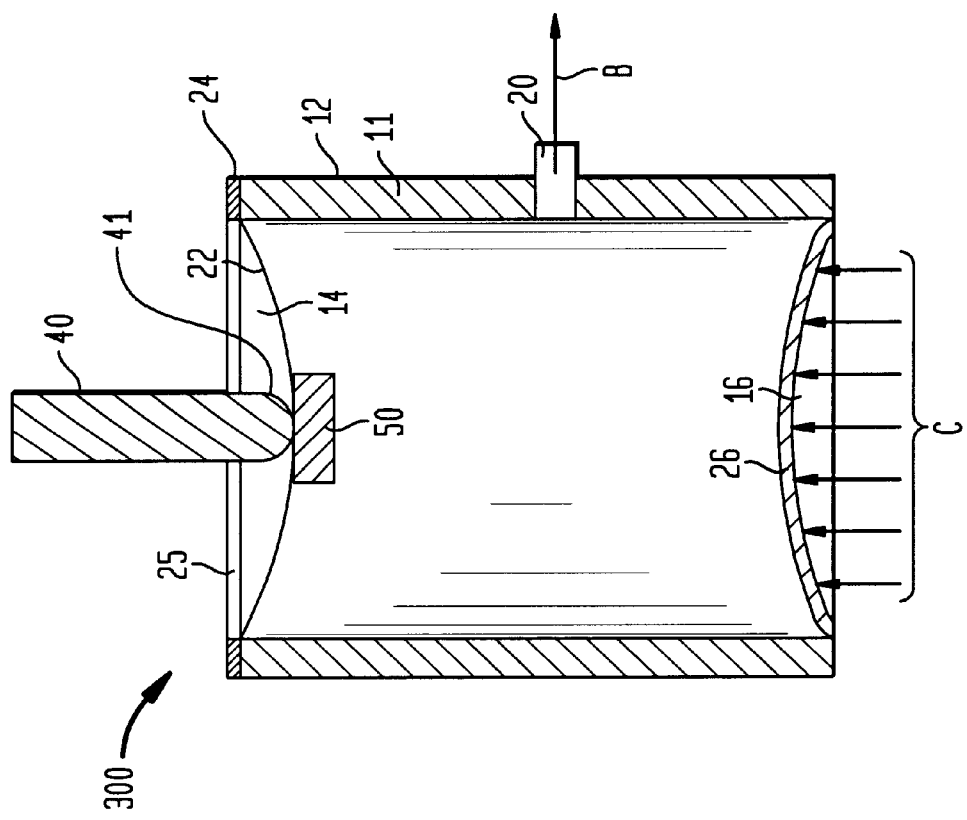
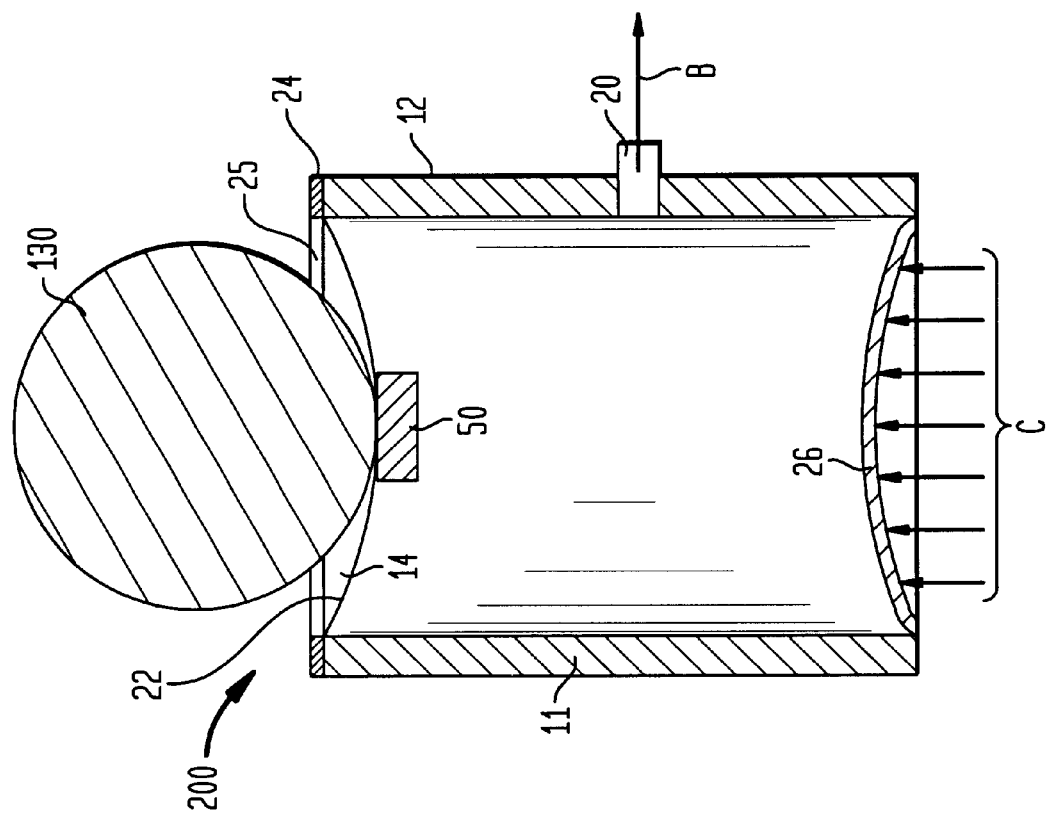

METHOD AND APPARATUS FOR REMOVING WORK PIECES ADHERED TO A SUPPORT

FIELD OF THE INVENTION

The present invention relates to the post processing stage in the manufacture of semiconductor work pieces. More particularly, the present invention relates to an apparatus and method for releasing work pieces from a mounting tape.

BACKGROUND OF THE INVENTION

Semiconductor work pieces, such as wafers, reticules, masks, frame leads, and integrated circuit packages are very small devices which are easily moved and even more easily broken. Conventionally, during processing, work pieces are adhered to a high adhesive tape, such as, for example, Nitto tape. After processing, the wafers are typically removed from the tape. It is imperative that the wafers be removed without being damaged, which is often difficult given that the adhesive tape used generally has high adherent characteristics.

There is, thus, a need in the industry for a low cost and effective method and apparatus for releasing work pieces from an adhesive material, for example, a tape without breaking the work piece.

SUMMARY OF THE INVENTION

The present invention provides a demounting apparatus which includes a conduit, a demounting mechanism, and a support structure having an adhered work piece which is to be removed. The conduit has a pair of opposed openings and a vacuum port. The demounting mechanism includes a vacuum source which exerts a vacuum through the vacuum port. The support structure is supported by the conduit and placed over one of the openings. The work piece is mounted on an undersurface of the support structure and the vacuum is exerted, causing the support structure to elastically deform. The deformation and the force of the vacuum combine to release the work piece from the support structure.

The present invention also provides a method of demounting a work piece. The method includes placing a support structure, which has a work piece affixed to a lower surface thereof, over an opening in a demounting apparatus, creating a pressure differential between an interior of the demounting apparatus and an exterior position near the demounting apparatus, such as by exerting a vacuum through the interior of the demounting apparatus to thereby pull a work piece away from the support structure.

These and other features and advantages of the invention will become more apparent from the following detailed description of preferred embodiments of the invention which is provided in conjunction with the accompanying drawings.

BRIEF DESCRIPTION OF THE DRAWINGS

FIG. 8 is a cross-sectional view of the demounting apparatus of FIG. 7 showing an inflated inflation device.

FIG. 9 is a cross-sectional view of a demounting apparatus constructed in accordance with a fourth embodiment of the present invention.

DETAILED DESCRIPTION OF PREFERRED EMBODIMENTS

Figure 1:
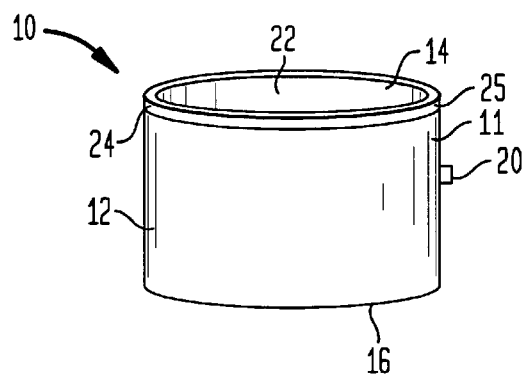
FIG. 1 is a perspective view of a demounting apparatus constructed in accordance with a first embodiment of the present invention.
Figure 2:
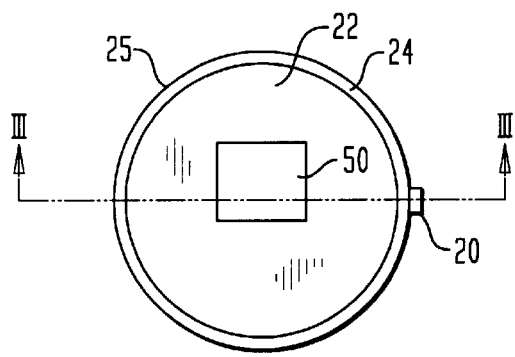
FIG. 2 is a top view of the demounting apparatus of FIG. 1.
Figure 3:
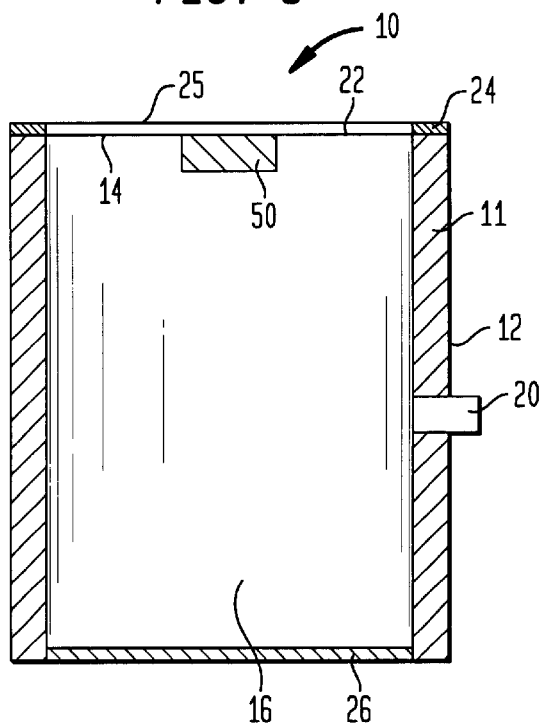
FIG. 3 is a cross-sectional view taken along line III—III of the demounting apparatus of FIG. 1.
Figure 4:
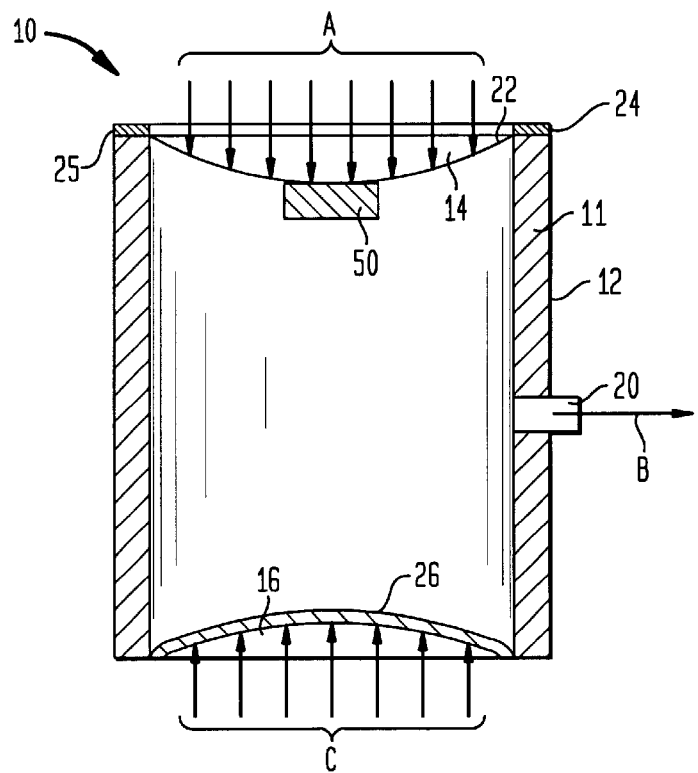
FIG. 4 is a cross-sectional view like FIG. 3 showing the force of air pressure acting on and a vacuum being exerted within the demounting apparatus of FIG. 1.

Referring now to the drawings, where like numerals designate like elements, there is shown in FIGS. 1–3 a demounting apparatus 10 including a conduit 11. The conduit 11 has a general cylindrical conduit wall 12 with a first end 14 and an opposed second end 16. The conduit wall 12 has an opening 20, through which a vacuum is pulled in a direction of the arrow B (FIG. 4). Although illustrated as being generally cylindrical, the conduit 11 may instead be rectangular or any other suitable tubular configuration.

As shown in FIG. 3, a cushion 26 is positioned within the second end 16. The cushion 26 is formed of an elastic material, such as, for example, an elastomer.

A support structure 25 having a work piece 50 adhered thereto is mounted on the conduit 11 over the first end 14. The support structure 25 comprises a hoop 24 and a tape 22 upon which a work piece 50 is adhered. The work piece 50 may be any element associated with semiconductor fabrication, such as, for example, a wafer or portion thereof, chip, reticule, mask, frame lead, or integrated circuit package. As shown, for example, in FIG. 3, the work piece 50 faces the interior of the conduit 11.

Figure 5:
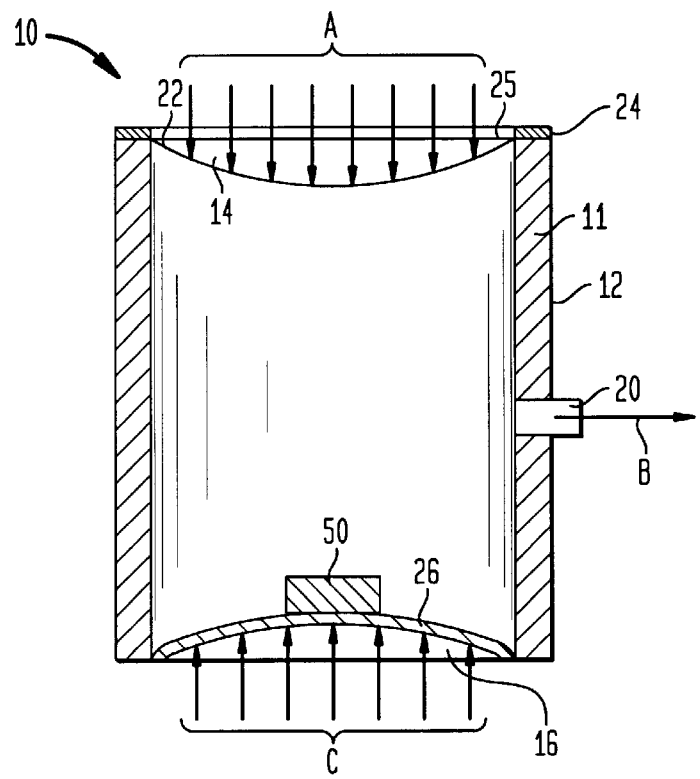
FIG. 5 is a cross-sectional view like FIG. 4 showing release of a work piece.

In operation, and with reference to FIGS. 4–5, a vacuum is drawn through the opening 20 in the direction of the arrow B. The vacuum creates a pressure differential between the interior of the conduit 11 and the exterior of the conduit 11. Particularly, the pressure within the conduit 11 is reduced relative to the pressure outside of the conduit 11. The resulting pressure differential causes air pressure to push the support structure 25 and the cushion 26 inwardly, as shown by, respectively, arrows A and C.

The force from the air pressure in the direction of the arrows A gives the support structure 25 a generally curved profile. Given that the work piece 50 is generally rectangular, the bent tape 22 pulls away from the work piece 50 such that the support structure 25 tends to lose some of its adherence to the flat side of the work piece 50. This loss of adherence, along with the force of the vacuum being exerted through the conduit 11, causes the work piece 50 to release from the support structure 25 and land on the cushion 26.

As noted above, the cushion 26 is made of a soft, generally elastic material capable of protecting the work piece 50 upon its release from the support structure 25. Further, the pressure differential created by the vacuum pulls the cushion 26 inwardly in the direction of the arrows C, giving the cushion 26 a generally curved profile. This curved profile reduces the distance the work piece 50 falls before being caught by the cushion 26.

By utilizing a pressure differential to create a curved profile for a support structure 25 upon which a semiconductor work piece 50 is mounted and a vacuum on the interior of conduit 11, the work piece 50 is easily released from the tape 22 of the support structure 25. Further, the work piece 50 is released undamaged. In addition, the use of a cushion 26 to catch the released work piece 50 assists in preventing damage to the work piece 50.

Figure 6:
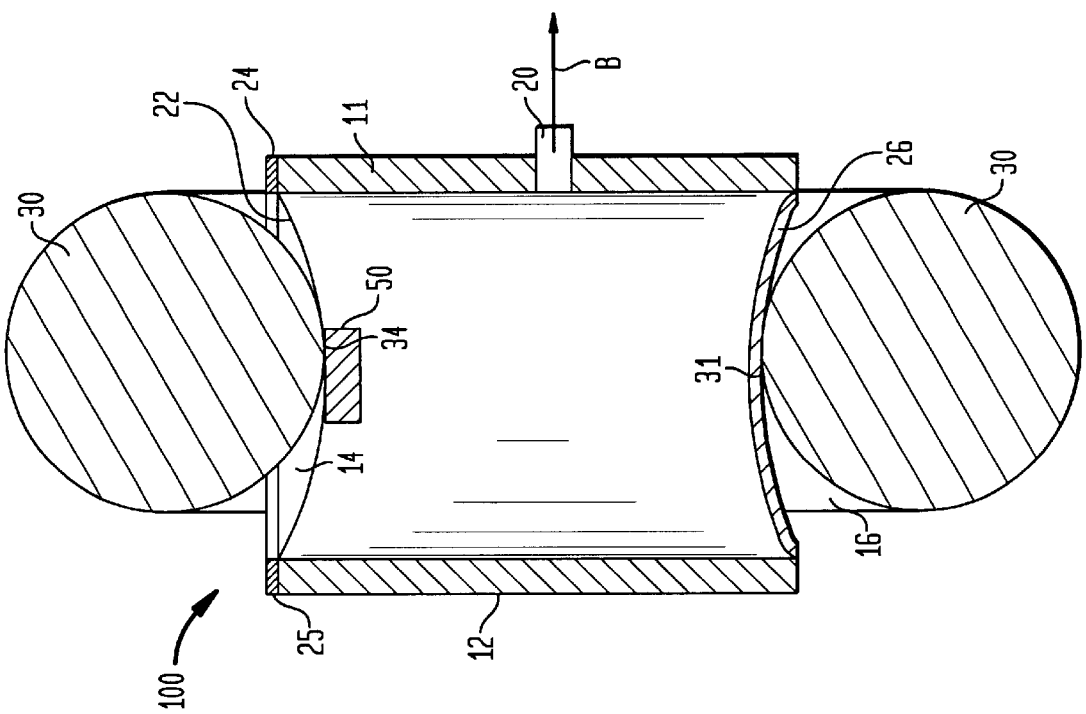
FIG. 6 is a cross-sectional view of a demounting apparatus constructed in accordance with a second embodiment of the present invention.

With reference to FIG. 6, another embodiment of the present invention is illustrated. A demounting apparatus 100 is shown having a conduit 11 and an inflatable device 30. The inflatable device 30, shown in its inflated state in FIG. 6, encircles the conduit 11 along a longitudinal axis thereof. Specifically, the inflatable device 30, shown in its inflated state in FIG. 6, is positioned such that it is over the first and second ends 14, 16. When first placed around the conduit 11, the inflatable device 30 is in a deflated state. Once positioned over the ends 14, 16, the inflatable device 30 is inflated. The device 30 may be inflated with any suitable media, such as, for example, air, any inert gas, or liquid, such as water.

Inflation of the device 30 causes the device 30 to both expand and to exert a constricting force on the support structure 25 and the cushion 26. Specifically, a surface 31 of the device comes in contact with the support structure 25 and the cushion 26. Further, inflation of the device 30 causes elastic deformation of both the support structure 25 and the cushion 26. Specifically, the cushion 26 and the support structure 25 are pushed inwardly in the same directions that they are pulled by the embodiment described above utilizing pressure differential, namely in the directions of, respectively, the arrows C and A (FIG. 4). As with the previously described embodiment, the curved profile of the support structure 25 creates a loss of adherence between the tape 22 and the work piece 50. That loss of adherence along with the exertion of a vacuum through the conduit 11 causes the work piece 50 to release from the tape 22 of the support structure 25, and be caught by the cushion 26.

Figure 10:
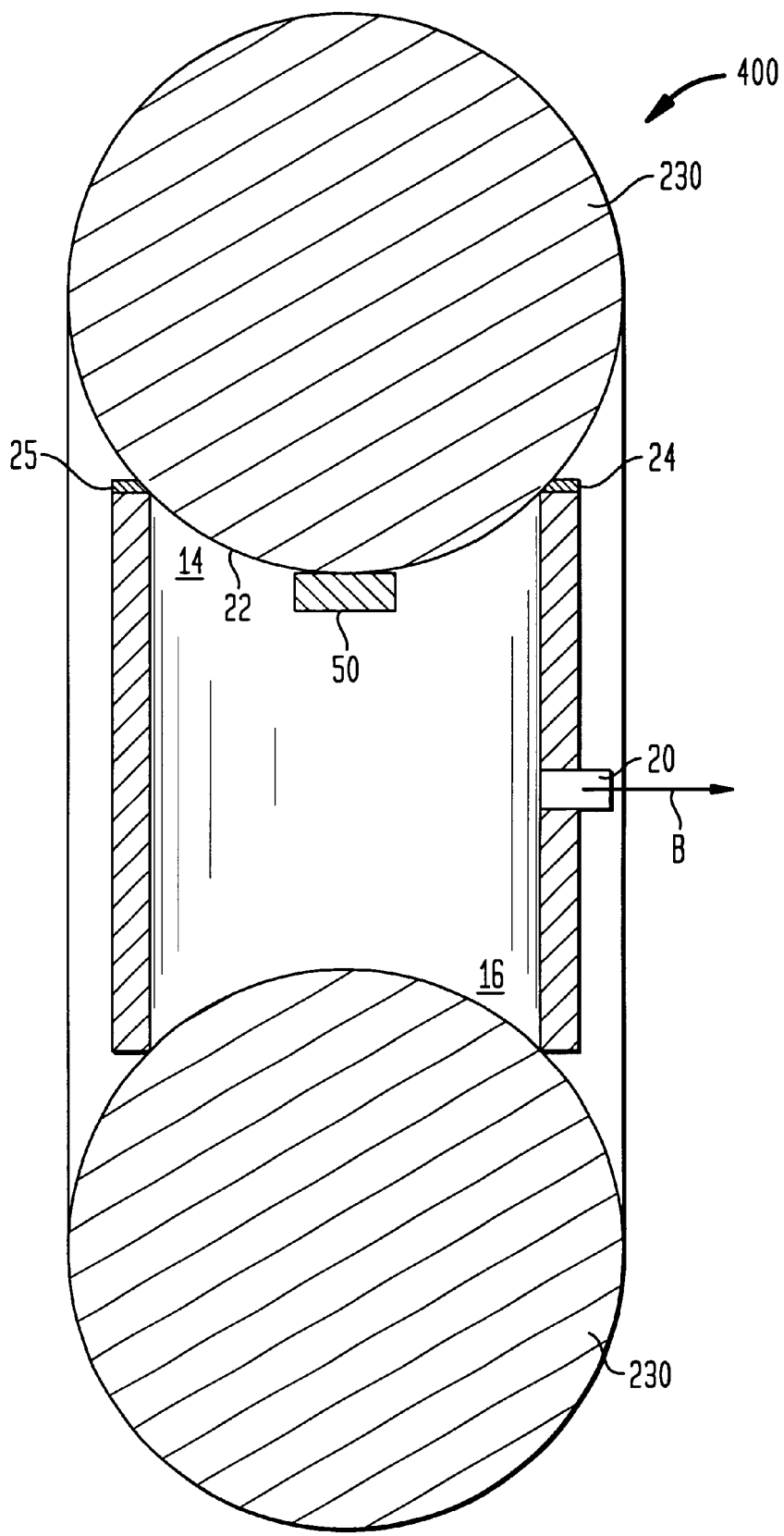
FIG. 10 is a cross-sectional view of a demounting apparatus constructed in accordance with a fifth embodiment of the present invention.

Although shown with the cushion 26, it is possible for the inflatable device 30 to be used without the cushion 26. Specifically, and as shown in FIG. 10, a demounting apparatus 400 has an inflatable device 230 which is sized and shaped when inflated so as to enclose the entire second end 16. Thus, it may not be necessary to include the cushion 26, as the device 230 will also act to catch the work piece 50 upon its release from the tape 22 and prevent the work piece 50 from becoming damaged.

Figure 7:
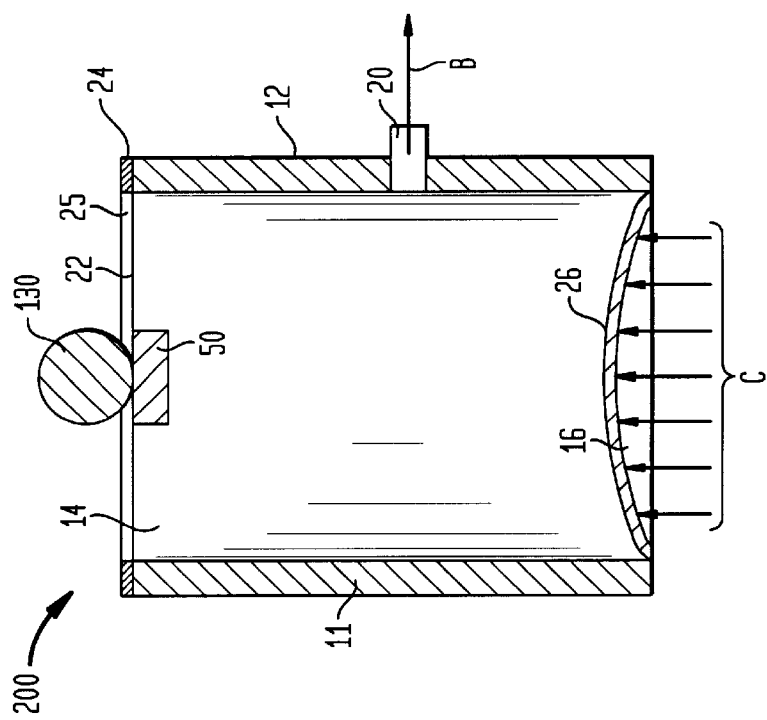
FIG. 7 is a cross-sectional view of a demounting apparatus constructed in accordance with a third embodiment of the present invention.

Although the devices 30, 230 are illustrated as completely surrounding the conduit 11, the invention is not so limited. FIGS. 7–8 illustrate a demounting apparatus 200 having an inflatable device 130. Specifically, FIG. 7 shows the device 130 in an uninflated state positioned over the support structure 25, while FIG. 8 shows the device 130 in an inflated state. The cushion 26 is being pressed inwardly (arrows C) by the pressure differential caused by the vacuum (arrow B). When deflated, the device 130 may take the form of a deflated balloon, and when inflated is generally circular, as shown in FIG. 8. The device 130 may be inflated by any suitable medium. Since the device 130 does not completely encircle the conduit 11, the constricting force as described with reference to the device 30 is absent, and so the device 130 should be inflated with a heavier medium, such as, for example, a liquid such as water. Although not illustrated, a similar inflatable device 130 may be placed over the second end 16 and used in lieu of the air pressure to force the cushion 26 inwardly. Further, as described above with reference to FIG. 10, the cushion 26 is optional and the device 130 may be sized and shaped to inflate and cover the second end 16.

With reference to FIG. 9, another embodiment of the present invention is shown, specifically, a demounting apparatus 300 including the conduit 11 and a piston 40. The piston 40 has a rounded end 41. The piston 40 is movable in a direction generally parallel to the conduit wall 12. In operation, the piston 40 is moved into contact with the support structure 25, thereby elastically deforming the support structure 25 and creating a curved profile. A vacuum is exerted in the direction of the arrow B, thereby enhancing the curved profile of the support structure 25 and inwardly pulling the cushion 26. The curved profile of the support structure 25 and the exertion of the vacuum assist in releasing the work piece 50 from the tape 22.

The present invention, as described above, provides an easy and effective way to release a semiconductor work piece from a highly adherent material without damage to the work piece. The present invention accomplishes this by forcing the adherent material to adopt a curved profile, which reduces the adherent properties on a portion of the work piece, and by exerting a vacuum force on the work piece to pull it from the adherent material.

While preferred embodiments of the invention have been described and illustrated, the invention is not limited by the foregoing description as many modifications and substitutions can be made without departing from the spirit and scope of the invention. For example, while some embodiments have been described as using a vacuum to pull the support structure 25 and the cushion 26 inwardly into the conduit 11, instead air pressure may be directed from an exterior of the conduit 11 at the support structure 25 and the cushion 26 to achieve the same curved profiles. A vacuum could also be used to assist in creating the curved profiles. Further, an air-tight cover may be required over the cylinder to contain the pressure. Accordingly, the scope of the present invention is not to be considered as limited by the specifics of the particular structure which have been described and illustrated, but is only limited by the scope of the appended claims.

What is claimed as new and desired to be protected by Letters Patent of the United States is:

1. An apparatus for removing a work piece from a support surface, said apparatus comprising:
    a housing having at least one opening and defining an interior space;
    a flexible support element having an adhered work piece, said support element covering said opening, with said work piece facing toward said interior space; and
    a flexing source for flexing said flexible support element and causing detachment of said work piece from said flexible support element, wherein said flexing source comprises a vacuum source for selectively providing a vacuum to said interior space sufficient to cause bending of said flexible support element.

2. The apparatus of claim 1, wherein said vacuum source creates a pressure differential between said interior space and a location exterior to said housing causing said flexible support element to elastically deform.

3. The apparatus of claim 1, further comprising:
    a second opening on said housing; and
    a constricting structure encircling said housing along a longitudinal axis thereof and over said openings, said flexing source also comprising said constricting structure.

4. The apparatus of claim 3, wherein said constricting structure comprises an inflatable elastic device positioned around said openings.

5. The apparatus of claim 4, wherein said elastic device is expandable to cover said openings.

6. The apparatus of claim 5, wherein said elastic device acts as a cushion for receiving the work piece after its detachment from said flexible support element.

7. The apparatus of claim 3, further comprising a cushion mounted in said second opening for receiving the work piece after its detachment from said flexible support element.

8. The apparatus of claim 7, wherein said cushion is a flexible material which flexes toward said interior when said constricting structure is inflated.

9. The apparatus of claim 8, wherein said constricting structure comprises an inflatable elastic device positioned around said openings.

10. The apparatus of claim 1, further comprising an expandable structure mounted over said opening.

11. The apparatus of claim 10, wherein said flexing source also comprises said expandable structure.

12. An apparatus for removing a work piece from a support surface, said apparatus comprising:
   a housing having at least one opening and defining an interior space;
   a flexible support element having an adhered work piece, said support element covering said opening, with said work piece facing toward said interior space;
   a flexing source for flexing said flexible support element and causing detachment of said work piece from said flexible support element; and
   a second opening and a cushion mounted in said second opening for receiving the work piece after its detachment from said flexible support element.

13. The apparatus of claim 12, wherein said cushion is a flexible material which flexes toward said interior space of said housing when the flexing source is applied.

14. The apparatus of claim 13, wherein said cushion is pulled inwardly into said interior space of said housing as a result of a pressure differential between said interior space and an exterior location near said housing.

15. The apparatus of claim 12, wherein said flexing source comprises an air source for selectively providing sufficient air pressure to cause bending of said support element and said cushion.

16. A demounting apparatus, comprising:
   a conduit having a first and a second opening;
   a support structure supporting a work piece to be demounted from said support structure, said support structure being supported by said conduit and placed over said first opening such that the work piece faces an interior of said conduit; and
   a flexing source for exerting a force on said support structure sufficient to elastically deform said support structure to thereby release the work piece from said support structure.

17. The apparatus of claim 16, further comprising a third opening, wherein said flexing source comprises a vacuum source for selectively providing a vacuum to said conduit interior through said third opening.

18. The apparatus of claim 17, wherein a pressure differential between an interior of said conduit and an exterior of said conduit causes said support structure to elastically deform.

19. The apparatus of claim 17, further comprising a cushion mounted in said second opening for receiving the work piece after its release from support structure.

20. The apparatus of claim 19, wherein said cushion is a flexible material which flexes toward said conduit interior when the vacuum is applied.

21. The apparatus of claim 20, wherein said flexible material is pulled inwardly into said conduit as a result of a pressure differential between said conduit interior and an exterior of said conduit.

22. The apparatus of claim 17, wherein said flexing source also comprises a constricting structure encircling said conduit along a longitudinal axis thereof and over said first and second openings.

23. The apparatus of claim 22, wherein said constricting structure comprises an inflatable elastic device mounted over said first and second openings.

24. The apparatus of claim 23, wherein said elastic device is expandable in a direction normal to the longitudinal axis of said conduit to cover said first and second openings.

25. The apparatus of claim 24, wherein said elastic device acts as a cushion for receiving the work piece after its release from said support structure.

26. The apparatus of claim 22, further comprising a cushion mounted over said second opening for receiving the work piece after its release from said support structure.

27. The apparatus of claim 26, wherein said cushion is a flexible material which elastically deforms toward said conduit interior when said constricting structure is inflated.

28. The apparatus of claim 27, wherein said constricting structure comprises an inflatable elastic device positioned over said first and second openings and said cushion.

29. The apparatus of claim 17, wherein said flexing source further comprises an expandable structure mounted on said first opening.

30. The apparatus of claim 17, wherein said flexing source further comprises a movable rod positioned radially exterior to said support structure, wherein said rod moves into contact with said support structure and causes said elastic deformation to said support structure.

31. A method of demounting a work piece from a flexible support structure to which it is adhered, said method comprising:
   placing the support structure over an opening of a demount device such that said work piece is supported to said opening by said flexible support structure; and
   applying a force across said opening to cause said flexible support structure to bend and separate from said work piece, wherein said force is at least in part produced by applying a vacuum to exert a force which pulls said support structure in a direction away from said work piece.

32. The method of claim 31, wherein said vacuum creates a pressure differential between an interior of the demounting apparatus and an exterior of the demounting apparatus causing said bending of said support structure.

33. The method of claim 32, further comprising receiving the work piece after its release from said support structure.

34. The method of claim 33, wherein the demount device comprises a second opening opposing the first opening, further comprising receiving the work piece on a cushioning surface after its release from said support structure.

35. The method of claim 31, wherein said force is provided by a constricting structure encircling the demount device along a longitudinal axis thereof.

36. The method of claim 35, wherein said force is applied by inflating the constricting structure which is positioned over the first opening and a second opening, wherein said inflation of the constricting structure produces an inwardly directed force causing bending of said support structure.

37. The method of claim 36, wherein the constricting structure comprises an inflatable elastic device, said elastic device expanding in a direction normal to the longitudinal axis of the demount device to cover the first and second openings.

38. The method of claim 37, further comprising receiving the work piece after its release from the support structure on a cushioning surface.

39. The method of claim 36, wherein the constricting structure receives the work piece after its release from the support structure.

40. The method of claim 39, further comprising receiving the work piece after its release from the support structure on a cushioning surface.

41. The method of claim 40, wherein the cushion is pushed inwardly by the constricting structure.

42. The method of claim 31, wherein said force is also produced by an expandable structure placed over the opening.

43. The method of claim 31, wherein said force further comprises a movable rod radially exterior to the support structure, the rod being moved into contact with the support structure.

44. A method of demounting a work piece from a flexible support structure to which it is adhered, said method comprising:
   placing the support structure over an opening of a demount device such that said work piece is supported to said opening by said flexible support structure;
   applying a force across said opening to cause said flexible support structure to bend and separate from said work piece, said force comprising a constricting structure around a circumference of the demount device; and
   exerting a vacuum through the interior of the demount device, the vacuum creating a pressure differential between an interior of the demount device and an exterior of the demount device.

45. The method of claim 44, wherein said force and said exertion of the vacuum combine to release the work piece from the support structure.

46. The method of claim 45, wherein the demount device comprises a second opening, said method further comprising receiving the work piece on a cushioning surface after its release from said support structure.

47. The method of claim 44, wherein the constricting structure comprises an inflatable elastic device encircling the demount device along a longitudinal axis thereof and over the first opening and a second opening, said method further comprising providing an inwardly directed force from the elastic device to the demount device causing bending of the support structure.

48. The method of claim 47, wherein the elastic device expands in a direction normal to the longitudinal axis of the demount device to cover the first and second openings.

49. The method of claim 48, further comprising the step of receiving the work piece on the elastic device after its release from the support structure.

50. The method of claim 47, further comprising the step of receiving the work piece on the elastic device after its release from the support structure.

51. The method of claim 50, further comprising receiving the work piece on a cushion area after its release from the support structure.

52. The method of claim 51, wherein the cushion area is pushed inwardly by the elastic device.

* * * * *